United States Patent [19]

Reustle

[11] Patent Number: 4,937,726
[45] Date of Patent: Jun. 26, 1990

[54] HIGH FORWARD BLOCKING VOLTAGE PROTECTION CIRCUIT

[75] Inventor: Hans Reustle, Aspach, Fed. Rep. of Germany

[73] Assignee: ANT Nachrichtentechnik GmbH, Backnang, Fed. Rep. of Germany

[21] Appl. No.: 373,681

[22] Filed: Jun. 28, 1989

Related U.S. Application Data

[63] Continuation of Ser. No. 279,647, Dec. 5, 1988, abandoned.

[30] Foreign Application Priority Data

Dec. 5, 1987 [DE] Fed. Rep. of Germany ....... 3741221

[51] Int. Cl.$^5$ .............................................. H02H 7/122
[52] U.S. Cl. ......................................... 363/56; 363/21; 363/131
[58] Field of Search ...................... 363/20, 21, 56, 131; 361/91

[56] References Cited

U.S. PATENT DOCUMENTS

| | | | |
|---|---|---|---|
| 3,628,047 | 12/1971 | Cronin | 363/56 |
| 4,268,898 | 5/1981 | Brown | 363/20 |
| 4,336,587 | 6/1982 | Boettcher et al. | 363/56 |
| 4,378,586 | 3/1983 | Bete | 363/56 |
| 4,403,269 | 9/1983 | Carroll | 363/56 |
| 4,438,486 | 3/1984 | Ferraro | 363/21 |
| 4,607,322 | 8/1986 | Henderson | 363/56 |
| 4,700,083 | 10/1987 | Raets | 307/253 |
| 4,754,385 | 6/1988 | McDade et al. | 363/56 |

FOREIGN PATENT DOCUMENTS

| | | |
|---|---|---|
| 2028435 | 12/1970 | Fed. Rep. of Germany . |
| 26447154 | 4/1978 | Fed. Rep. of Germany . |
| 3422777 | 1/1986 | Fed. Rep. of Germany . |
| 3538184 | 4/1987 | Fed. Rep. of Germany . |
| 3609375 | 9/1987 | Fed. Rep. of Germany . |
| 1065997 | 1/1984 | U.S.S.R. . |
| 1257778 | 9/1986 | U.S.S.R. . |
| 2132433 | 7/1984 | United Kingdom . |

OTHER PUBLICATIONS

Clemente, et al., "Apply a Few Design Rules to Avoid Destroying Power FETs", *Electronic Design News*, May 13th, 1981, pp. 126–130.

*Primary Examiner*—Patrick R. Salce
*Assistant Examiner*—Jeffrey Sterret
*Attorney, Agent, or Firm*—Spencer & Frank

[57] ABSTRACT

To protect a semiconductor switch from high forward blocking voltage stresses during turn-off, a relief circuit is provided comprising a diode and a capacitor. The energy generated when the semiconductor switch is turned off or switched to the non-conducting state, is temporarily stored in the capacitor of the relief circuit until the semiconductor switch is changed back to its conducting state. Then the energy stored in the capacitor is transferred to a useful impedance by means of a further semiconductor switch being changed to its conducting state.

10 Claims, 3 Drawing Sheets

FIG. 3
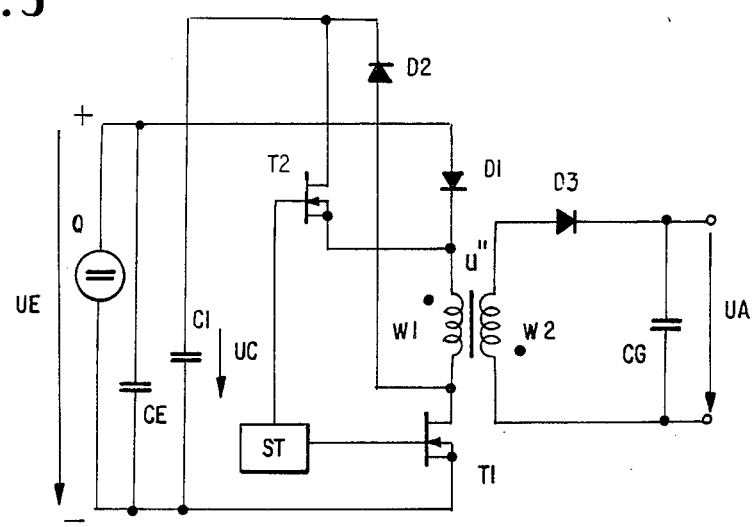
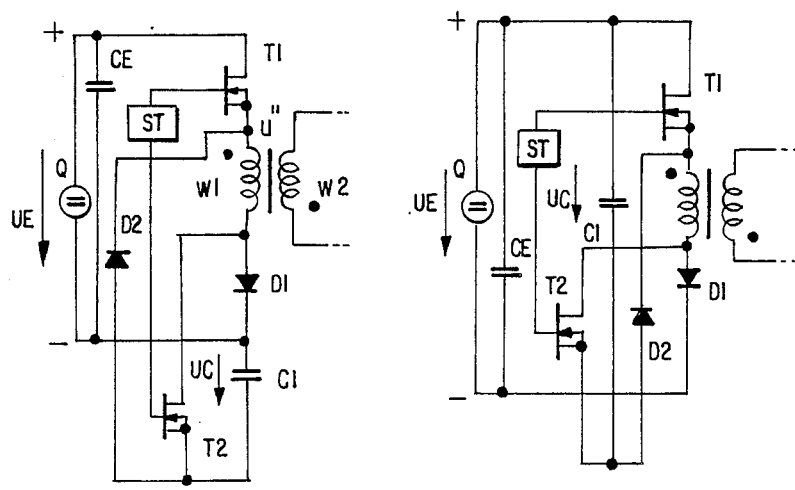
FIG. 4  FIG. 5

HIGH FORWARD BLOCKING VOLTAGE PROTECTION CIRCUIT

This application is a continuation of application Ser. No. 279,647, filed Dec. 5, 1988, now abandoned.

BACKGROUND OF THE INVENTION

The present invention relates to arrangements for freeing or protecting a semiconductor switch from high forward blocking voltage stresses, often referred to as voltage spikes or voltage transients, which occur when the semiconductor switch changes from a conducting state to a non-conducting or blocking state. More particularly, the present invention relates to a system which protects the semiconductor switch against such voltage stresses or spikes and which provides for utilization of the energy which creates the voltage spikes, thus increasing the efficiency of the system.

In the past, circuits have been provided for freeing or protecting a semiconductor switch from high forward blocking voltage stresses, i.e., voltage spikes or transients, which occur as the switch is turned off. For example, DE-OS No. 3,609,375 discloses an arrangement for freeing or protecting a semiconductor switch from such high forward blocking voltages by providing a capacitor-diode circuit, called a "snubber", to absorb the energy during turn-off of the semiconductor switch by charging the capacitor of the snubber. The diode of this snubber is connected to a current converter transformer, and the capacitor of the snubber is discharged through the current converter transformer and is fed back to a voltage source, e.g. the voltage source driving the load current, by way of a useful impedance.

in arrangements according to DE-OS No. 2,644,715, oscillator circuits are provided for protecting the semiconductor switches. The oscillator circuits are composed of capacitors, inductances and diodes, and although the arrangements according to DE-OS No. 2,644,715 permit utilization of the energy during turn-off of the semiconductor switch, the arrangements require expensive circuitry. Furthmore, the parameters for such circuits are often critical.

U.S. Pat. No. 4,700,083 discloses a semiconductor switch which is equipped with a voltage limiting device including an oscillator circuit. It is also known to protect a semiconductor switch against excess voltage stresses by equipping it with a so-called RCD network (DE-OS No. 3,538,184; Electronic Design News, May 1981, pages 126–130). When using an RCD network the protection is realized by the dissipation of energy in an ohmic resistor.

SUMMARY OF THE INVENTION

Hence the present invention provides for protection of a semiconductor switch against forward blocking voltage stresses which occur as the switch is turned-off, by storing the energy which would otherwise cause the voltage stresses, and thereafter utilizing the stored energy to increase the efficiency of the system.

Accordingly, it is an object of the present invention, based on the arrangement according to DE-OS No. 3,609,375, to provide a system which permits discharge and use of the stored energy in a simple manner and which, in particular, is able to operate without additional inductive components. Moreover, a use for such arrangement is disclosed. This is accomplished with respect to the arrangement of the present invention, where a first semiconductor switch is adapted to permit current to flow through useful impedance where a relief circuit including a capacitor is charged as the first semiconductor switch is turned off, and where switch means are provided for discharging the capacitor as the first semiconductor switch is again turned on.

It is a further object of the present invention to provide for the protection of a semiconductor switch against high forward blocking voltages which occur as the switch is turned off, where the semiconductor switch which is to be prottected is part of a DC/DC converter having a primary inductance, and where the energy which is stored to protect the semiconductor switch is discharged when the semiconductor switch is turned on.

It is yet another object of the present invention to provide a system for protection of a semiconductor switch against high forward blocking voltage stresses, and to utilize the energy which is stored to protect the semiconductor switch to increase the efficiency of the system, where a second semiconductor switch is provided and where the first and second semiconductor switches are simultaneously controlled to be conducting.

It is another feature or benfit of the present invention that only a small number of additional components are required. For example, in some systems, depending upon the voltage levels, it is merely necessary to provide an additional semiconductor switch and an additional diode. By utilizing the energy which is stored as the semiconductor switch is protected against forward blocking voltages, in a systems where the circuit is employed as a DC/DC converter, efficiency can be improved considerably in a simple manner. Problems which occur in the prior art in connection with oscillator techniques—resonance turning, stability, delays—are not encountered by the present invention.

BRIEF DESCRIPTION OF THE DRAWINGS

The foregoing features and benfits of the present invention, together with other objects and advantages which may be attained by its use, will become apparent upon reading the following detail description of the invention taken in conjunction with the drawings, wherein one embodiment of the invention will now be described.

In the drawings, wherein like reference characters identify corresponding components:

FIGS. 3, 4, and 5 are modifications to the basic circuit diagram according to FIG. 1.

DESCRIPTION OF THE PREFERRED EMBODIMENT

Figure 1:
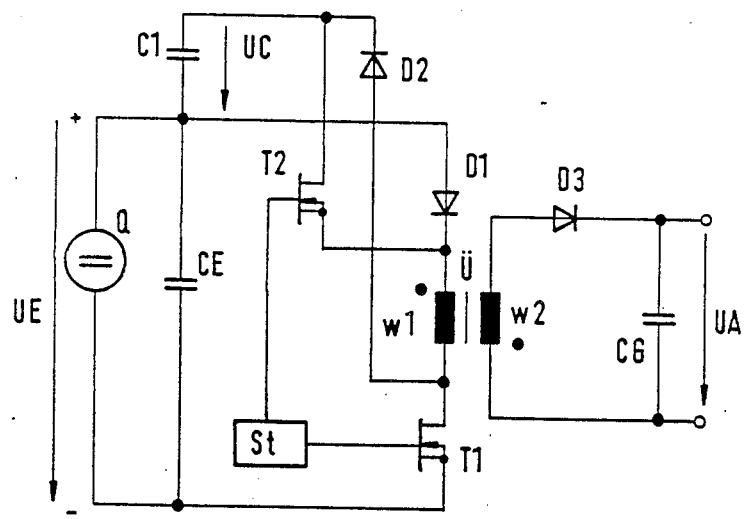
FIG. 1 is a basic circuit diagram for a semiconductor switch equipped with a protective circuit and employed in a DC/DC converter.

In FIG. 1, a first semiconductor switch T1 is shown connected as a control member in a DC/DC converter. A d.c. voltage source Q provides an input voltage. An input smoothing capacitor CE is connected across the terminals of the voltage source Q. The positive terminal of the voltage source Q is provided to one side of a series combination comprising a diode D1, a power transformer Ü and the switching path of the first semiconductor switch which, in the present invention, is a field effect transistor T1. More specifically, the positive output of the voltage source is connected to the anode of diode D1, and the cathode of diode D1 is connected to one side of a primary winding of the power transformer. Thus the polarity of the diode D1 is such that when the field effect transistor T1 is in the conducting state, current is able to flow from voltage source Q through the primary winding w1. Power transformer Ü constitutes in view of transistor T1 a useful impedance which can be connected to a load circuit of a DC/DC converter. Specifically, power transformer Ü represents an inductance here the main inductance of a blocking converter. The power transformer includes a secondary winding w2 and a smoothing capacitor CG is provided across the secondary winding. A conventional diode D3 is provided in the secondary of the power transformer between the winding w2 and the smoothing capacitor CG. An output voltage UA is obtained across the terminals of the smoothing capacitor CG as is conventional.

Transistor T1 is illustrated as a conventional FET, or field effect transistor, having gate, source and drain electrodes. A relief circuit, —a so-called "snubber"— is provided between the drain electrode of the FET and the positive terminal of the voltage source Q. The relief circuit protects the first semiconductor switch against too high a forward blocking voltage stress during turn-off. The relief circuit comprises the series combination of a diode D2 and a capacitor C1. The diode D2 has its anode connected to the drain of electrode the FET T1, and its cathode connected to one side of the capacitor C1; the other side of the capacitor C1 is connected to the positive terminal of the input voltage source Q. Thus the polarity of the diode D2 is such that with field effect transistor T1 in the blocking or non-conducting state, a current will flow through diode D2 to charge capacitor C1.

The circuit of the present invention includes a second semiconductor switch T2, also illustrated in the preferred embodiment as a field effect transistor having gate, source and drain electrodes as is conventional. The drain electrode is connected to the junction of the diode D2 and the capacitor C1, and the source electrode is connected to the junction of the diode D1 and the primary winding w1 of the load. This circuit arrangement permits the capacitor C1 to discharge through the load.

In the embodiment shown in FIG. 1, the relief circuit is disposed between the drain electrode of FET T1 and the positive terminal of input voltage source Q. It is, of course, contemplated to position the relief circuit between the drain electrode and the negative terminal of the voltage surce Q, in which case, it is merely necessary to slightly modify the circuit as will be understood by those of ordinary skill in the art.

One of such modifications is shown in FIG. 3. Here the relief circuit is disposed between the drain electrode of FET T1 and the negative terminal of input voltage source Q. All other components are arranged as shown in FIG. 1.

In the modification shown in FIG. 4 the drain electrode of FET T1 is connected to the positive terminal of voltage source Q. The source electrode of FET T1 is in series connected via winding w1 and diode D1 to the negative terminal of voltage source Q. The series combination of diode D2 and capacitor C1 as part of the relief circuit is arranged between the source electrode of FET T1 and the negative terminal of voltage source Q. Field effect transistor T2 has its drain electrode connected to the junction of winding w1 with the anode of diode D1 and its source electrode connected to the junction of capacitor C1 with the anode of diode D2.

The embodiment of FIG. 5 is similar to the embodiment of FIG. 4 with the only difference that capacitor C1 is connected to the positive terminal of voltage source Q.

Figure 2:
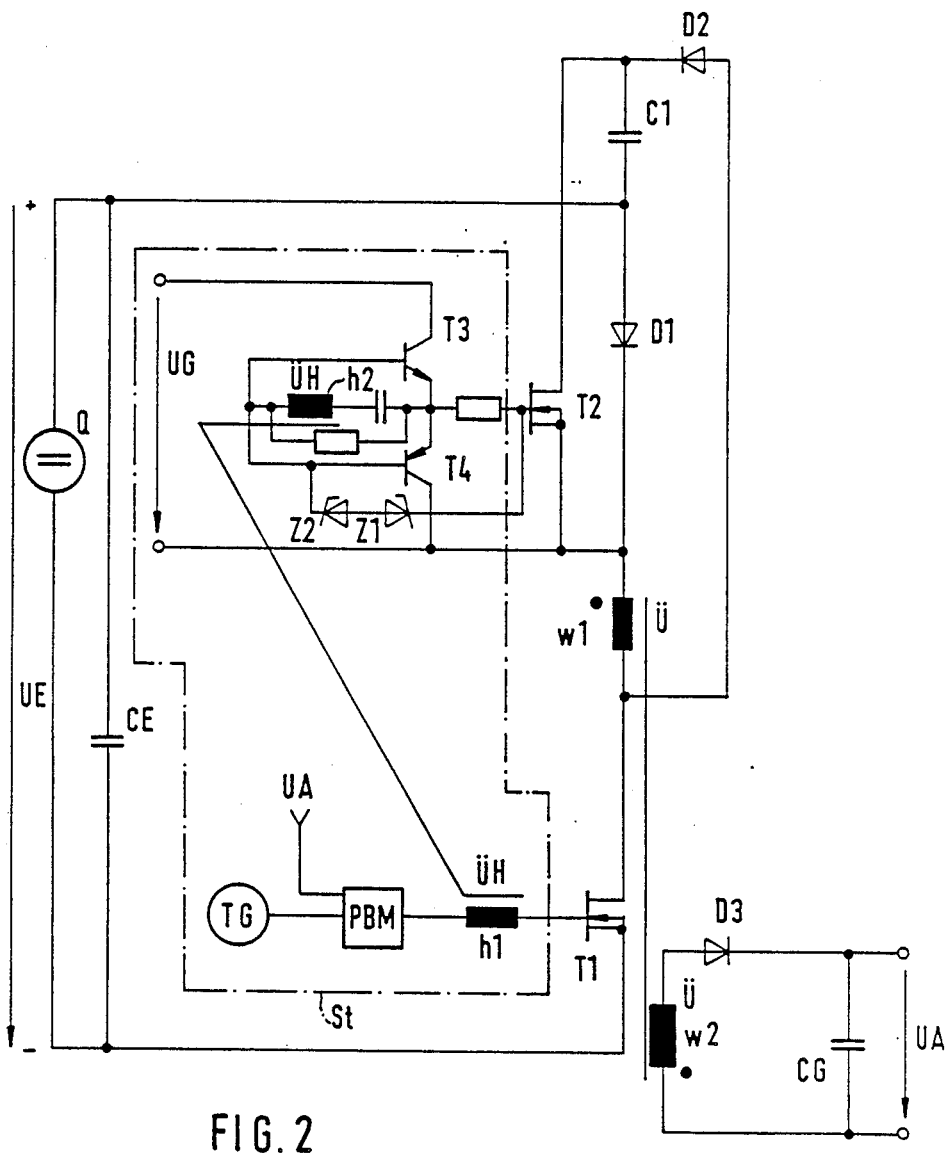
FIG. 2 is a basic circuit diagram according to FIG. 1 including details of a control circuit St of FIG. 1 for actuating the semiconductor switch.

The embodiment of FIGS. 1 and 4 are advantageous in view of minimizing voltage stresses of capacitor C1. The embodiments of FIGS. 2 and 3 are advantageous in view of protecting FET T1 from high voltage stresses. The embodiments of FIGS. 1 or 4 can be for high voltage applications preferably.

The operation of the circuit as illustrated in FIG. 1 will now be explained. If field effect transistor T1 is truned on (i.e., in a conducting state) by means of a control circuit St providing an input to the gate electrode of FET T1, current flows through the diode D1, through the winding w1 on the primary side of power transformer Ü, and through the switching path of field effect transistor T1. This energizes the primary side of the power transformer. Then, if field effect transistor T1 is opened (i.e., blocked or turned off or non-conducting) by control circuit St, the relative polarity of the voltage across the primary winding w1 changes, and a relief current flows through diode D2 to charge capacitor C1. In this capacitor C1, the so-called "relief energy" is temporarily stored until control circuit St again switches the field effect transistor T1 into the conducting state. At the same time as the change of field effect transistor T1 to the conducting state, field effect transistor T2 is also switched to the conducting state by means of the control circuit St. The voltage UE+UC is then present across primary winding w1, with UE representing the input voltage of source Q and UC representing the voltage across capacitor C1. With field effect transistor T2 in the conducting state, capaitor C1 is able to discharge through transistor T2 and then through the power transformer Ü until it reaches the voltage level -UDI of diode D1. Thus a useful return energy or back energy feed is relized by simple means, namely, the stored energy is discharged to provide energy to the useful impedance - inductance of power transformer Ü.

Referring next to FIG. 2, the control circuit St is illustrated in greater detail in FIG. 2. The control circuit St, which is illustrated in broken lines within the circuit of FIG. 2, is suitable to actuate the two field effect transistors T1 and T2. A clock pulse generator TG controls a pulse width modulator PBM to provide turn-on pulses for field effect transistor T1 in a conventional manner. The output pulses from the clock pulse generator TG are varied in width as a function of the magnitude of output voltage UA. The control circuit St includes an auxiliary transformer ÜH which has primary and secondary windings, h1 and h2, as is conventional. The primary winding h1 is connected between the output of pulse width modulator PBM and the gate terminal of field effect transistor T1. The secondary winding h2 of auxiliary transformer ÜH is connected in the emitter-base circuit of a push-pull driver stage composed of complementary bipolar transistors T3 and T4. The complementary bipolar transistors have their emitters connected together and their bases connected together. The output signal of the push-pull driver stage controls field transistor T2. Thus, field effect transistor T2 receives its turn-on and blocking pulses in synchronism with the turn-on and blocking pulses received by field effect transistor T1. Opposed, anode-to-anode connected Zener diodes Z1 and Z2, positioned with their respective cathodes between the gate of field effect transistor T2 and the base of the driver stage transistors, contitutes a protective circuit. To supply the push-pull driver stage with current, an auxiliary voltage UG is required across the collectors of the complementary transistors of the driver stage, and this auxiliary voltage may likewise by obtained from input direct voltage source Q. The push-pull driver stage may be equipped with a conventional anti-saturation device.

The foregoing is a complete description of a preferred embodiment of the present invention. Many changes may be made without departing from the spirit and scope of the present invention. The invention, therefore, should be limited only by the scope of the following claims.

The present disclosure relates to the subject matter disclosed in Federal Republic of Germany Patent Application No. P 37 41 221.3, filed December 5th, 1987, the entire disclosure of wihch is hereby incorporated by reference.

What is claimed is:

1. In a system for protecting a semiconductor switch from high forward blocking voltage stresssses during turn-off the circuit including a first semiconductor switch which is to be protected, said first semiconductor switch having two primary electrodes and adapted to be connected to a useful impedance, and to a voltage source, and a series combination of a diode and a capacitor, one side of the diode connected to a primary electrode of the semiconductor switch and one side of the capacitor adapted to be connected to the voltage source, the diode polarity as connected being such that if the semiconductor switch is in the blocked state, a charging current for the capacitor is able to flow, the improvement comprising:

a second diode having one electrode adapted to be connected to the voltage source and a second electrode adapted to be connected to the useful impedance, the diode polarity as connected being such that, if the first semiconductor switch is in the conducting state, a current is able to flow from the input voltage source through the useful impendance; and a second semiconductor switch having two primary electrodes, one primary electrode of the second semiconductor switch being connected to the capacitor and the other primary electrode of the second semiconductor switch connected to the second diode and adapted to be connected to the useful impedance, for discharging the capacitor when the first semiconductor switch is switched to the conducting state;

said second semiconductor switch receiving its turn-on and its blocking pulse in synchronism with the turn-on and blocking pulse received by the first semiconductor switch by means of a common control circuit.

2. In a system for protecting a semiconductor switch from high forward blocking voltage stresses during turn-off, the system including a first semiconductor switch to be protected, the first semiconductor switch adapted to permit current to flow through a useful impedance when the first semiconductor switch is in a conducting state, the system including a relief circuit including a capacitor connected to be charged when the first semiconductor switch is turned off, the improvement comprising:

switch means for discharging the capacitor when the first semiconductor switch is switched to the conducting state, said switch means receiving conducting and turn-off signals in synchronism with conducting and turn-off signals received by the first semiconductor switch.

3. In a system for protecting a semiconductor switch from high forward blocking voltage stresses when the semiconductor switch is changed to a non-conducting state, the system including a source of direct voltage, a first semiconductor switch to be protected, and a useful impedance, the first semiconductor switch having two primary electrodes, the first semiconductor switch and the useful impendance being connected in series, and connected to said voltage source, and a relief circuit including a diode and a capacitor, the relief circuit disposed between a primary electrode of the semiconductor switch and a terminal of voltage source, with the diode having a polarity as connected such that if the semiconductor switch to be protected is in a non-conducting state, a current flows to charge the capacitor, the improvement comprising:

a further diode being provided in the circuit between the useful impedance and the voltage source, and having a polarity as connected such that if the first semiconductor switch is in the conducting state, current is able to flow from the voltage source through the load; and a further semiconductor switch having two primary electrodes, one primary electrode connected in the relief circuit and the primary electrode connected between the useful impedance and the further diode, respectively, for discharging the capacitor when the first semiconductor switch is switched back to the conducting state, said further semiconductor switch and said first semiconductor switch being switched in synchronism between conducting states and non-conducting states.

4. The system as defined in claim 3, wherein the useful impedance is primary inductance of a DC/DC converter, and wherein the semiconductor to be protected is the switching member of the DC/DC converter.

5. The system as defined in claim 3, and further including a driver stage for the further semiconductor switch, and an auxiliary transformer for controlling the switching of the further semiconductor switch between conducting and non-conducting states;

the auxiliary transformer having a primary winding and a secondary winding, the primary winding being connected such that signals therethrough cause the semiconductor switch which is to be protected to switch between conducting and non-conducting states, and the secondary winding of the auxiliary transformer being connected to said driver stage for controlling the switching of the further semiconductor switch between conducting and non-conducting states, for said switching in synchronism.

6. A system for protecting a first semiconductor switch from high blocking voltage stresses during turn-off comprising:

a first semiconductor switch which is to be protected, said first semiconductor switch adapted to be connected to a voltage source and to a useful impedance;

a relief circuit including a capacitor, the relief circuit operatively connected to said first semiconductor switch and adapted to be connected to said voltage source for charging the capacitor in said relief circuit when said first semiconductor switch is in the blocked state;

a diode having one electrode adapted to be connected to the voltage source and a second electrode adapted to be connected to the useful impedance; and a second semiconductor switch operatively connected to said relief circuit and to a said diode and adapted to be connected to said useful impedance; for discharging said capacitor through the useful impedance when the first semiconductor switch is switched back to the conducting state, said first and second semiconductor switches being switched in synchronism between conducting and non-conducting states.

7. The system as defined in claim 6, wherein said first semiconductor switch is a field effect transistor having two primary electrodes, and said diode is connected in series with the two primary electrodes of said first semiconductor switch.

8. The system as defined in claim 6, wherein control means are provided for said synchronous switching said first semiconductor switch and said second semiconductor switch in to the conducting state.

9. The system as defined in claim 8, wherein said control means includes a driver stage for controlling the switching of said second conductor switch between conducting and non-conducting states.

10. The system as defined in claim 8, wherein said control means further includes an auxiliary transformer for simultaneously switching said first semiconductor switch and said second semiconductor switch between conducting and non-conducting states.

* * * * *